(12) United States Patent
Han

(10) Patent No.: US 7,595,268 B2
(45) Date of Patent: Sep. 29, 2009

(54) SEMICONDUCTOR PACKAGE HAVING RE-DISTRIBUTION LINES FOR SUPPLYING POWER AND A METHOD FOR MANUFACTURING THE SAME

(75) Inventor: Kwon Whan Han, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/777,407

(22) Filed: Jul. 13, 2007

(65) Prior Publication Data
US 2008/0315394 A1 Dec. 25, 2008

(30) Foreign Application Priority Data
Jun. 20, 2007 (KR) .................... 10-2007-0060261

(51) Int. Cl.
H01L 21/44 (2006.01)
H01L 23/02 (2006.01)
H01L 23/48 (2006.01)
H01L 23/52 (2006.01)
H01L 23/053 (2006.01)
H01L 23/12 (2006.01)
H01L 29/40 (2006.01)

(52) U.S. Cl. ........................ 438/678; 438/674; 257/678; 257/680; 257/690; 257/691; 257/693; 257/700; 257/737; 257/738; 257/E21.03; 257/E21.174; 257/E21.175

(58) Field of Classification Search ................ 257/678, 257/680, 690–691, 693, 700, 737, 738, E21.03, 257/E21.174, E21.175; 438/674, 678
See application file for complete search history.

(56) References Cited

U.S. PATENT DOCUMENTS

| | | | | |
|---|---|---|---|---|
| 5,989,993 | A * | 11/1999 | Zakel et al. | 438/614 |
| 6,025,275 | A * | 2/2000 | Efland et al. | 438/722 |
| 6,448,171 | B1 * | 9/2002 | Wang et al. | 438/614 |
| 6,624,060 | B2 * | 9/2003 | Chen et al. | 438/613 |
| 6,730,982 | B2 * | 5/2004 | Barth et al. | 257/529 |
| 6,906,422 | B2 * | 6/2005 | Fjelstad | 257/773 |
| 6,911,624 | B2 * | 6/2005 | Koopmans | 219/209 |
| 7,008,867 | B2 * | 3/2006 | Lei | 438/613 |
| 7,233,076 | B2 * | 6/2007 | Matsuki et al. | 257/795 |
| 7,449,099 | B1 * | 11/2008 | Mayer et al. | 205/122 |
| 7,452,749 | B2 * | 11/2008 | Tachibana | 438/108 |
| 7,465,653 | B2 * | 12/2008 | Huang et al. | 438/613 |
| 2007/0054439 | A1 * | 3/2007 | Yang | 438/127 |
| 2008/0050901 | A1 * | 2/2008 | Kweon et al. | 438/597 |
| 2008/0157341 | A1 * | 7/2008 | Yang et al. | 257/700 |

FOREIGN PATENT DOCUMENTS

JP 2001-156172 A 6/2001
KR 1020030006915 A 1/2003

* cited by examiner

Primary Examiner—Ida M Soward
(74) Attorney, Agent, or Firm—Ladas & Parry LLP

(57) ABSTRACT

A semiconductor package and a method for manufacturing the same capable of supplying power easily without an increase in the number of pads for power supply. The semiconductor package includes a semiconductor chip having a plurality of pads including pads for power supply disposed in a center portion and an internal wiring disposed to be exposed to outside; an insulating film formed on the semiconductor to expose the pads for power supply and the internal wirings; and re-distribution lines formed on the insulating film to connect between the exposed portions of the pads for power supply and the internal wiring.

10 Claims, 3 Drawing Sheets

SEMICONDUCTOR PACKAGE HAVING RE-DISTRIBUTION LINES FOR SUPPLYING POWER AND A METHOD FOR MANUFACTURING THE SAME

CROSS-REFERENCE TO RELATED APPLICATIONS

The present application claims priority to Korean patent application number 10-2007-00 filed on Jun. 20, 2007, which is incorporated herein by reference in its entirety.

BACKGROUND OF THE INVENTION

The present invention relates to a semiconductor package, and more particularly to a semiconductor package and a method for manufacturing the same which, can easily supply power without an increase in the number of pads required for the power supply.

The latest semiconductor device, e.g., Dynamic Random Access Memory (DRAM) has been manufactured to have high density and velocity. Chips of higher velocity and performance require operational characteristics of low voltage to reduce the amount of power used and heat generated due to the amount of power used.

However, in order to satisfy such characteristics, a larger number of the pads are required for power supply. The ability to increase the number of pads within the chip is limited and it makes total size of the chip greater, which results in increasing a product cost.

The latest semiconductor chip of higher velocity and performance requires a larger number of the pads for power supply, and such pads must be formed only on specific locations that enable wire bonding in an assembly process. However, the size of the chip must be necessarily increased in order accommodate a larger number of pads in the specific locations. This causes an increase in the product cost.

Moreover, in the typical DRAM device the pads are arranged in a center portion to be manufactured as package of a Board On Chip (BOC) type using a substrate with a window. It is difficult to supply sufficient power because the power is supplied to edge portions of the chip via a metal wire connected to the pads in the center portion.

In addition, since the semiconductor chip is manufactured using fine processes, proposals for the size, the number and the pitch of the pad are very limited. A pitch for a lead frame or substrate used for packaging the semiconductor chip is very great due to limitation of the process. Therefore, although a sufficient number of pads is formed on the semiconductor chip to supply the power, it is possible to connect all of the pads via the wire due to a difference between the pitch of the pad and the pitch of the lead frame.

Moreover, a lot of the time and cost is involved because the whole semiconductor chip must be redesigned or additional metal wiring must be formed via a Fab process in order to prepare additional power or signal wiring.

SUMMARY OF THE INVENTION

Embodiments of the present invention are directed to a semiconductor package, which can achieve low voltage characteristics without an increase in a chip size.

Further, embodiments of the present invention are directed to a semiconductor package capable of supplying sufficient power.

Moreover, embodiments of the present invention provide a semiconductor package capable of reducing production time and cost despite securing the low voltage characteristics.

According to one embodiment of the present invention, a semiconductor package may comprise a semiconductor package comprises a semiconductor chip having a plurality of pads including pads for power supply disposed in a center portion and an internal wiring disposed to be exposed to outside; an insulating film formed on the semiconductor to expose the pads for power supply and the internal wirings; and re-distribution lines formed on the insulating film to connect between the exposed portions of the pads for power supply and the internal wiring.

The number of the pads for power supply is at least two and the exposed internal wirings is at least one.

The internal wirings and the re-distribution lines of which at least one is exposed respectively are all connected with each other.

The re-distribution line is composed of a metal film, and the metal film is formed with a layer of Au or any one alloy layer of Cu/Ni/Au, Cu/Au and Ni/Au with Au formed thereon.

The semiconductor package further comprises a capping film formed on the insulating film and the re-distribution lines to expose one portion of the re-distribution line and the power supply bonding pads.

According to another embodiment of the present invention, a method for manufacturing a semiconductor package comprising steps of forming an insulating film on a semiconductor chip having a plurality of pads including pads for power supply disposed in a center portion and an internal wiring disposed to be exposed to outside; exposing the pads for power supply and one portion of the internal wirings by etching the insulating film; and forming re-distribution lines on the insulating film to connect between the exposed pads for power supply and the exposed portion of the internal wirings.

The number of the pads for power supply and the exposed internal wirings connected via the re-distribution lines is at least one each.

The re-distribution lines are formed in such a way to connect between the exposed internal wirings and the re-distribution lines of which the number is at least one respectively.

The step of forming the re-distribution lines is carried out via an electrolysis plating process.

The step of forming the re-distribution lines using the electrolysis plating process comprises steps of forming a seed metal film on a passivation film including the exposed pads for power supply and the exposed portion of the internal wirings; forming a mask pattern on the seed metal film to expose a re-distribution line forming area selectively; plating the metal film on the seed metal film exposed; and eliminating the mask pattern and one portion of the seed metal film beneath the mask pattern.

The mask pattern forms a photosensitive film pattern.

The metal film is formed with Au or any one alloy layer of Cu/Ni/Au, Cu/Au and Ni/Au with Au formed thereon.

The method for manufacturing the semiconductor package further comprises a step of forming a capping film formed on the insulating film including the re-distribution lines to expose each of one portion of the re-distribution lines and the power supply bonding pads.

The method for manufacturing the semiconductor package further comprises a step of back-grinding a back surface of the semiconductor chip after forming the capping film.

The method for manufacturing the semiconductor package performs the step of forming the insulating film through the step of back-grinding the back surface of the semiconductor chip at wafer level.

The method for manufacturing the semiconductor package further comprises a step of sawing at chip level after backgrinding the back surface of the semiconductor at wafer level.

DESCRIPTION OF SPECIFIC EMBODIMENTS

According to a preferred embodiment of the present invention, one portion of internal wirings formed on a semiconductor chip is exposed, re-distribution lines to connect the exposed internal wiring and pads for power supply to each other are formed through a re-distribution line process at a wafer level, and thereafter a known packaging process can proceed.

Since the power can be directly supplied to the internal wiring via the re-distribution lines, it is not necessary to increase the number of the pads for power supply. Therefore, according to the present invention the semiconductor chip can be of high speed and high performance and have low voltage characteristics without an increasing the chip size caused by increasing the number of the pads for the power supply.

Further, since the present invention allows the power to be supplied to the internal wirings in edge portions via the re-distribution lines, and not to the metal wire, it becomes possible to supply sufficient power.

In addition, the power can be easily supplied because the present invention does not require a size of an exposed portion of the internal wiring to be limited differently from when the bonding pad used for bonding the wire is formed.

In addition, with the present invention it is possible to prevent an increase in production time and cost because it does not require redesign of the whole semiconductor chip or the formation of a separate metal wiring via a Fab process for supplying the power.

Figure 1:
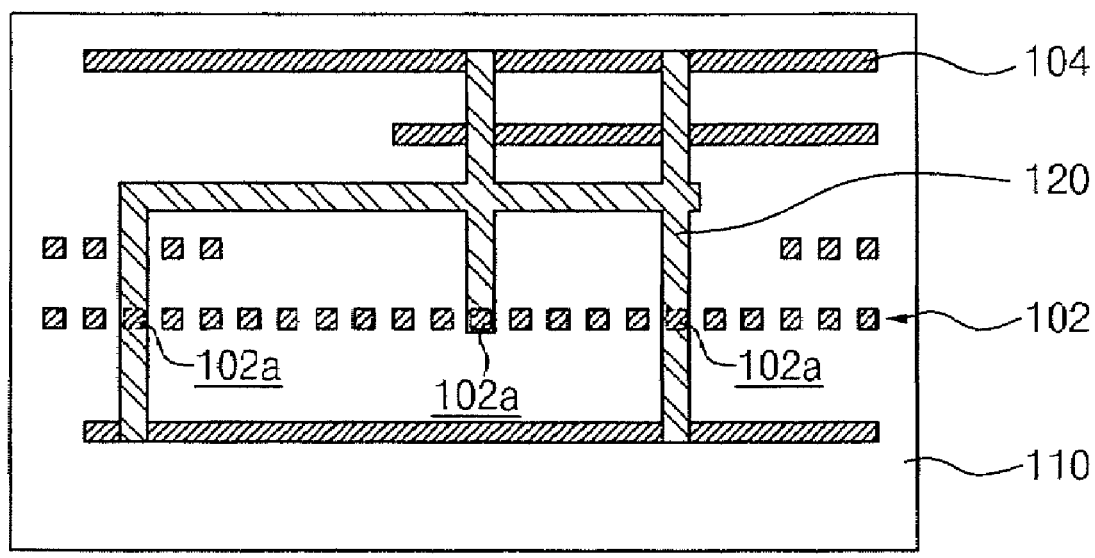
FIG. 1 is a plan view illustrating a semiconductor package in accordance with one embodiment of the present invention.

FIG. 1 is a plan view illustrating a semiconductor package according to an embodiment of the present invention. The semiconductor package will be specifically described referring to FIG. 1.

As shown in FIG. 1, the semiconductor chip 100 includes a plurality of bonding pads 102 including pads for power supply 102a and wirings 104. The plurality of bonding pads 102 including the pads for power supply 102a is arranged in one row or 2 rows at a center portion of the semiconductor chip 100. The number of the pads for power supply 102a is at least two. The wirings 104 is formed to be arranged in, for example, an edge portion within the semiconductor chip 100 in chip production process, and the number of the wirings is at least one.

The semiconductor chip 100 has a passivation film 106 formed on a surface thereof, and the passivation film is formed to expose the bonding pads 102 including the pads for power supply 102a together with the internal wirings 104.

An insulating film 110 is formed on the passivation film 106 of the semiconductor chip 100 to expose the plurality of bonding pads 102 including pads for power supply 102a and one portion of the internal wirings 104.

Further, re-distribution lines 120 are formed on the insulating film 110 to connect the exposed portion of the internal wirings 104 and the pads for power supply 102a with each other. The re-distribution lines 120 are formed through an electrolysis plating process, and are responsible for transferring the power applied via the pads for power supply 102a to the internal wiring 104. Such re-distribution lines 120 are formed to connect between the internal wirings 104 and the pads for power supply 102a of which the number is at least one respectively. The re-distribution lines composed of a metal film, for example, a film of Au or any one alloy film of Cu/Ni/Au, Cu/Au and Ni/Au with Au disposed thereon.

Although not shown, a capping film is formed on the insulating film 110 with the re-distribution lines 120 formed thereon to protect the re-distribution lines 120. The capping film is formed to expose the bonding pads 102 including the pad for power supply 102a and one portion of the re-distribution lines 120.

Further, the semiconductor chip 100 as mentioned above is attached on, for example, a substrate with circuit pattern including electrode terminals and ball lands, the electrode terminal of the substrate and the bonding pads 102 including the pads for power supply 102a are bonded via the metal wire, a top surface of the semiconductor chip 100 including the metal wire is sealed with molding material, and solder balls are attached to the ball lands on a bottom surface of the substrate to function as an external connection terminal, thereby making a semiconductor package.

The semiconductor package according to an embodiment of the present invention can allow the power to be supplied more easily to the semiconductor chip without an increase in the number of the pads for power supply by connecting the pads for power supply with the internal wiring via the re-distribution lines, thereby manufacturing the semiconductor chip with low voltage characteristics.

Hereinafter, a method for manufacturing the semiconductor package according to an embodiment of the present invention mentioned above will be described referring to FIG. 2A through 2E.

Figure 2A:
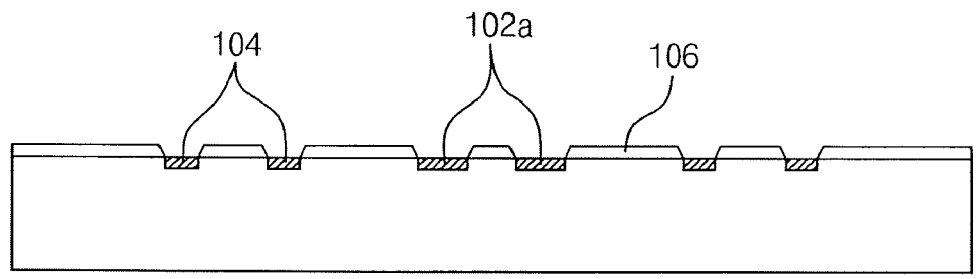
FIGS. 2A through 2E are cross-sectional views illustrating the process steps of a method for manufacturing the semiconductor package in accordance with an embodiment of the present invention.

Referring to FIG. 2A, there is provided a semiconductor chip 100 which has a plurality of bonding pads including pads for power supply 102a disposed in a center portion thereof and internal wirings 104 disposed in internal edges, and has a passivation film 106 formed on a surface thereof so as to expose the power supply bonding pads 102a. The internal wirings 104 are exposed by etching the passivation film 106 on the surface of the semiconductor chip 100.

Figure 2B:
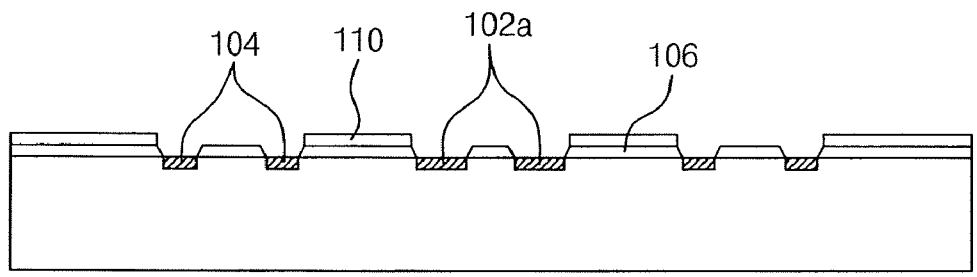

Referring to FIG. 2B, after forming an insulating film 110 on the passivation film 106 of the semiconductor chip 100, the plurality of bonding pads including the pad for power supply 102a, as well as the internal wirings 104 are allowed to be exposed by etching the insulating film 110.

Figure 2C:
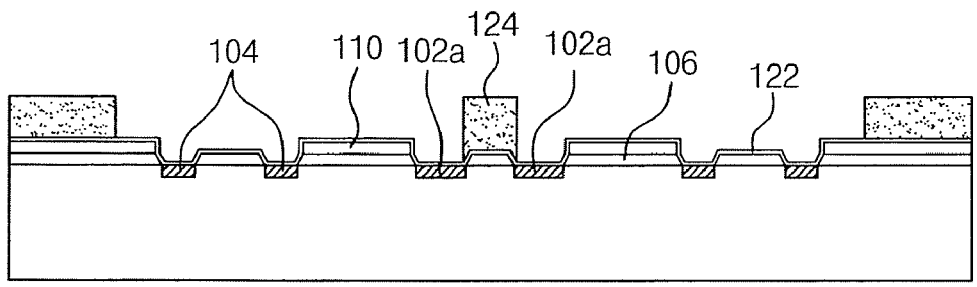

Referring to FIG. 2C, a seed metal film 122 is formed on the passivation film 106 of the semiconductor chip 100 including the exposed power supply bonding pads 102a and the internal wirings 104 to be used for an electrolysis plating. Thereafter, a mask pattern 124 is formed on the seed metal film 122 so as to expose only re-distribution line forming areas selectively. The mask pattern 124 is preferably a photosensitive film pattern formed via a photolisography process.

Figure 2D:
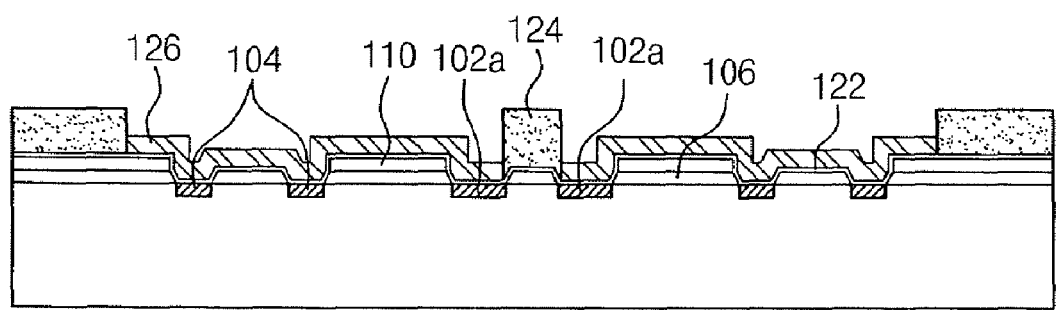

Referring to FIG. 2D, a metal film 126 is plated on exposed portion of the seed metal film 122 via an electrolysis plating process. The metal film 126 is formed with a single film of Au or any one alloy film of Cu/Ni/Au, Cu/Au and Ni/Au with Au formed on uppermost layer.

Figure 2E:
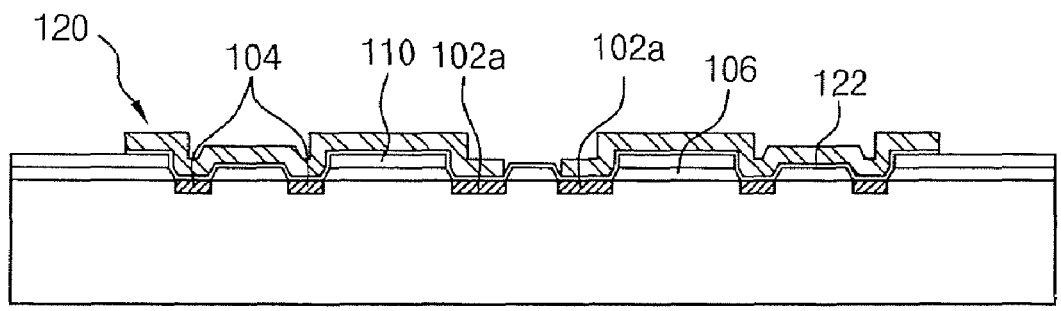

Referring to FIG. 2E, the re-distribution lines 120 are formed to connect all of the pads for power supply 102a and the internal wirings 104 with each other, by eliminating the mask pattern and one portion of the seed metal 122 beneath the mask pattern. Thereafter, the capping film (not shown) is formed to expose the pads for power supply 102a and one portion of the re-distribution line 120 on the insulating film 110.

Subsequently, although not shown, the thickness of the semiconductor chip 100 is lowered by back-grinding a back surface of the semiconductor chip 100 formed with the capping film 130. Then, the semiconductor chip will be attached to the substrate. The electrode terminal of the substrate and the plurality of bonding pads 102 including the pads for power supply 102a are connected with each other via the metal wire. And then, a top surface of the semiconductor chip 100 including the metal wire is filled with molding materials, and solder balls are attached on the bottom surface of the substrate so as to function as the external connection terminal, thereby to complete manufacturing the semiconductor package.

All of the steps of exposing the internal wirings, the step of forming the insulating film, and a step of back-grinding the back surface of the semiconductor chip are performed at wafer level. Then a step of sawing after back-grinding the back surface of the semiconductor chip at wafer level is performed at chip level.

Since the present invention performs subsequent packaging processes in a state that the re-distribution line is formed to connect between the bonding pads and the internal wirings via the wafer-level process for the manufactured semiconductor chip, it is possible to easily provide the semiconductor package having low voltage characteristics.

Moreover, because the present invention can supply the power directly to the internal wiring via the re-distribution line, it is possible to prevent an increase in the chip size.

Moreover, the present invention can supply sufficient power since the power can be directly supplied to the internal wirings.

In addition, the whole semiconductor chip, does not need to be redesigned or does a separate metal wiring need to be formed via a Fab process for the purpose of supplying the power, thereby preventing increase in product time and cost for the semiconductor chip.

Although a specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor package comprising the steps of:
    forming an insulating film on a semiconductor chip having a plurality of pads including pads for power supply disposed in a center portion and an internal wiring exposed to outside the semiconductor chip;
    exposing the pads for power supply and one portion of the internal wirings by etching the insulating film; and
    forming re-distribution lines via an electrolysis plating process on the insulating film to connect the exposed pads for power supply and the exposed portion of the internal wirings.

2. The method for manufacturing the semiconductor package according to claim 1, wherein the number of the pads for power supply and the exposed internal wirings connected via the re-distribution lines is at least one each.

3. The method for manufacturing the semiconductor package according to claim 2, wherein the re-distribution lines are formed in such a way to connect between the exposed internal wirings and the re-distribution lines of which the number is at least one respectively.

4. The method for manufacturing the semiconductor package according to claim 1, wherein forming the re-distribution lines via the electrolysis plating process comprises:
    forming a seed metal film on a passivation film attached to the semiconductor chip including the exposed pads for power supply and the exposed portion of the internal wirings;
    forming a mask pattern on the seed metal film to expose a re-distribution line forming area;
    plating the metal film on the exposed portion of the seed metal film; and
    eliminating the mask pattern and a portion of the seed metal film beneath the mask pattern.

5. The method for manufacturing the semiconductor package according to claim 4, wherein the mask pattern comprises a photosensitive film pattern.

6. The method for manufacturing the semiconductor package according to claim 4, wherein the metal film includes Au or any one alloy film of Cu/Ni/Au, Cu/Au and Ni/Au with Au formed thereon.

7. The method for manufacturing the semiconductor package according to claim 1, further comprising a step of forming a capping film formed on the insulating film to expose each of one portion of the re-distribution lines and the pads for power supply.

8. The method for manufacturing the semiconductor package according to claim 7, further comprising back-grinding a back surface of the semiconductor chip after forming the capping film.

9. The method for manufacturing the semiconductor package according to claim 8, wherein the step of forming the insulating film through the step of back-grinding the back surface of the semiconductor chip is performed at wafer level.

10. The method for manufacturing the semiconductor package according to claim 9, further comprising sawing at chip level after back-grinding the back surface of the semiconductor at wafer level.

* * * * *